US008786050B2

(12) United States Patent
Su et al.

(10) Patent No.: US 8,786,050 B2
(45) Date of Patent: Jul. 22, 2014

(54) HIGH VOLTAGE RESISTOR WITH BIASED-WELL

(75) Inventors: Ru-Yi Su, Kouhu Township, Yunlin County (TW); Fu-Chih Yang, Fengshan (TW); Chun Lin Tsai, Hsin-Chu (TW); Chih-Chang Cheng, Hsinchu (TW); Ruey-Hsin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 322 days.

(21) Appl. No.: 13/100,714

(22) Filed: May 4, 2011

(65) Prior Publication Data
US 2012/0280361 A1 Nov. 8, 2012

(51) Int. Cl.
*H01L 21/02* (2006.01)
(52) U.S. Cl.
USPC .......................................... 257/538
(58) Field of Classification Search
USPC ......................................... 257/538
See application file for complete search history.

(56) References Cited

U.S. PATENT DOCUMENTS

| 4,750,028 | A | 6/1988 | Ludikhuize |
| 5,382,826 | A | 1/1995 | Mojaradi et al. |
| 5,585,640 | A | 12/1996 | Huston et al. |
| 6,225,647 | B1 | 5/2001 | Kurtz et al. |
| 6,525,390 | B2 * | 2/2003 | Tada et al. ............ 257/489 |
| 6,677,680 | B2 | 1/2004 | Gates et al. |
| 6,680,515 | B1 | 1/2004 | Hsing |
| 6,770,517 | B2 | 8/2004 | Nakoaka et al. |
| 6,784,077 | B1 | 8/2004 | Lin et al. |
| 6,879,005 | B2 | 4/2005 | Yamaguchi et al. |
| 2004/0155317 | A1 | 8/2004 | Bhattacharyya |
| 2004/0227140 | A1 | 11/2004 | Lee et al. |
| 2007/0020840 | A1 | 1/2007 | Chindalore |
| 2008/0142830 | A1 | 6/2008 | Huang et al. |
| 2010/0073076 | A1 | 3/2010 | Fu et al. |

FOREIGN PATENT DOCUMENTS

TW    233703 B    6/2005

OTHER PUBLICATIONS

Koichi Endo et al., "A 500V 1A 1-Chip Inverter IC With a New Electric Field Reduction Structure", Proc. Of the 6th Internat. Symposium on Power Semiconductor Devices & IC's, Davos, Switzerland, May 31-Jun. 2, 1994, IEEE, Cat. No. 94CH3377-9, pp. 379-383.
Unpublished Non-Provisional U.S. Appl. No. 12/652,294, "High Voltage Devices and Methods for Forming the High Voltage Devices" filed Jan. 5, 2010.

(Continued)

*Primary Examiner* — Bradley K Smith
(74) *Attorney, Agent, or Firm* — Haynes and Boone, LLP (57) ABSTRACT

Provided is a high voltage semiconductor device. The semiconductor device includes a doped well located in a substrate that is oppositely doped. The semiconductor device includes a dielectric structure located on the doped well. A portion of the doped well adjacent the dielectric structure has a higher doping concentration than a remaining portion of the doped well. The semiconductor device includes an elongate polysilicon structure located on the dielectric structure. The elongate polysilicon structure has a length L. The portion of the doped well adjacent the dielectric structure is electrically coupled to a segment of the elongate polysilicon structure that is located away from a midpoint of the elongate polysilicon structure by a predetermined distance that is measured along the elongate polysilicon structure. The predetermined distance is in a range from about 0*L to about 0.1*L.

20 Claims, 9 Drawing Sheets

(56) References Cited

OTHER PUBLICATIONS

M. Faiez Ktata, et al., "When Are Substrate Effects Important for On-Chip Interconnects?", 0-7803-8128-9/03, 2003 IEEE, pp. 265-268.

Canham, L. T., "Silicon quantum wire array fabrication by electrochemical and chemical dissolution of wafers," Appl. Phys. Lett., vol. 57, No. 10 (Sep. 3, 1990) pp. 1046-1048.

Liu, C. W., et al., "Hot carrier recombination model of visible electroluminescence from metal-oxide silicon tunneling diodes," Appl. Phys. Lett. vol. 77, No. 26 (Dec. 25, 2000) pp. 4347-4349.

Rebohle, L., et al, "Strong blue and violet photoluminescence and electroluminescence from germanium-implanted and silicon-implanted silicon-dioxide layers," Appl. Phys. Lett., vol. 71, No. 19 (Nov. 10, 1997) pp. 2809-2811.

Shcheglov, K. V., et al., "Electroluminescence and photoluminscence of Ge-implanted Si/SiO2/Si structures," Appl. Phys. Lett., vol. 66, No. 6 (Feb. 6, 1995) pp. 745-747.

Shimizu-Iwayama, Tsutomo, et al., "Visible photoluminescence in Si+ implanted silica glass," J. Appl. Phys., vol. 75 No. 12 (Jun. 15, 1994) pp. 7779-7783.

Non-Final Office Action dated Jul. 19, 2013 for U.S. Appl. No. 13/160,030 (11 pages).

\* cited by examiner

HIGH VOLTAGE RESISTOR WITH BIASED-WELL

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Various types of passive circuit components may be fabricated on a semiconductor wafer. For example, a resistor may be formed as a passive circuit component on a wafer. Some applications require these resistors to withstand high voltages, for example voltages as high as a few hundred volts. However, conventional high voltage resistors may suffer from device breakdown issues before a sufficiently-high voltage is reached.

Therefore, while existing high voltage resistor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
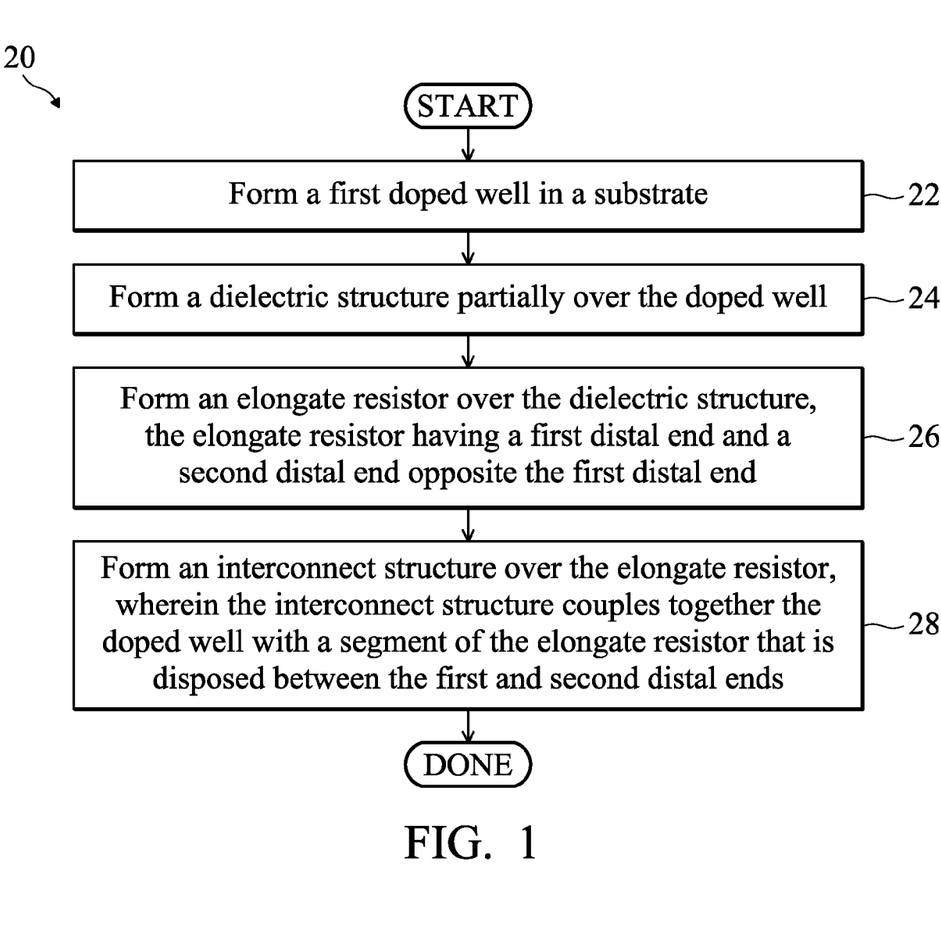
FIG. 1 is a flowchart illustrating a method for fabricating a high voltage semiconductor device according to various aspects of the present disclosure.

Illustrated in FIG. 1 is a flowchart of a method 20 according to various aspects of the present disclosure. The method 20 begins with block 22 in which a first doped well is formed in a substrate. The method 20 continues with block 24 in which a dielectric structure is formed partially over the doped well. The method 20 continues with block 26 in which an elongate resistor over the dielectric structure. The elongate resistor has a first distal end and a second distal end opposite the first distal end. The method 20 continues with block 28 in which an interconnect structure is formed over the elongate resistor. The interconnect structure couples together the doped well with a segment of the elongate resistor. The segment is disposed between the first and second distal ends.

FIGS. 2-5 are diagrammatic fragmentary cross-sectional side views of various portions of a semiconductor wafer at various fabrication stages according to embodiments of the present disclosure. It is understood that FIGS. 2 to 5 have been simplified for a better understanding of the inventive concepts of the present disclosure.

Figure 2:
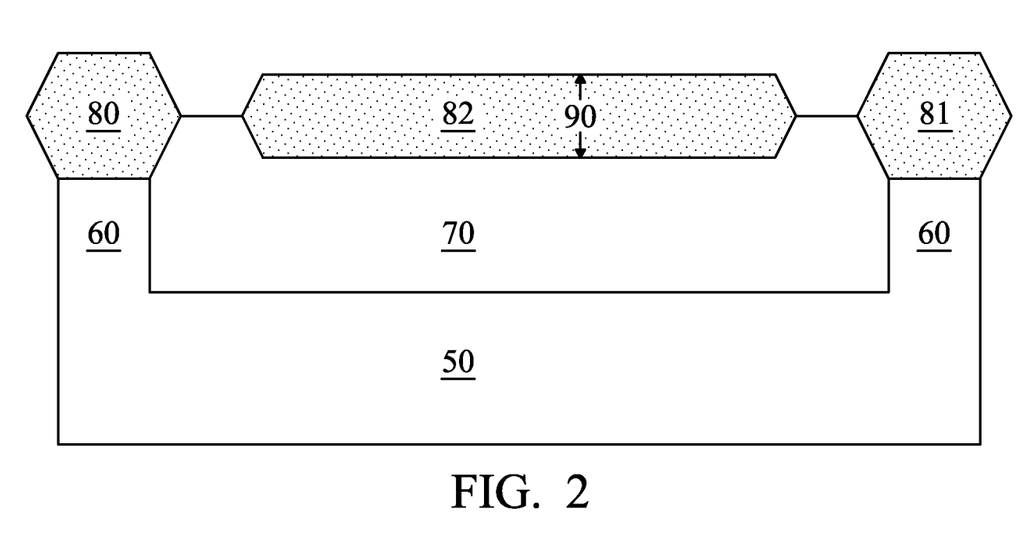
FIGS. 2-5 are diagrammatic fragmentary cross-sectional side views of a portion of a wafer at various stages of fabrication in accordance with various aspects of the present disclosure.

Referring to FIG. 2, a portion of a substrate 50 is illustrated. The substrate 50 is doped with a P-type dopant such as boron. In another embodiment, the substrate 50 may be doped with an N-type dopant such as phosphorous or arsenic. The substrate 50 may also include other suitable elementary semiconductor materials, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 50 could include an epitaxial layer (epi layer), may be strained for performance enhancement, and may include a silicon-on-insulator (SOI) structure.

Doped wells 60 are formed in the substrate. The doped wells 60 are doped with the same doping polarity as that of the substrate. In the embodiment shown, the doped wells 60 are formed to be P-wells. A high voltage well 70 is then formed in the substrate 50. The high voltage well 70 is doped with a dopant having an opposite doping polarity than the substrate 50. Thus, the high voltage well 70 is a high voltage N-well (HVNW) in the embodiment shown. One or more buried N-wells (not illustrated herein) may also be formed in the substrate 50 before the HVNW 70 is formed. The doped wells 60, the HVNW 70, and the buried N-wells may be formed by a plurality of ion implantation processes known in the art. For example, the HVNW 70 may be formed by an implantation process having a dose that is in a range from about $3\times10^{12}$ atoms/centimeter$^2$ to about $4\times10^{12}$ atoms/centimeter$^2$. The buried N-wells may be formed by an implantation process having a dose that is in a range from about $1\times10^{12}$ atoms/centimeter$^2$ to about $2\times10^{12}$ atoms/centimeter$^2$. The doped wells 60, the HVNW 70, and the buried N-wells may also be referred to as doped regions.

Isolation structures 80-81 are formed over the doped wells 60, and an isolation structure 82 is formed over the HVNW 70. The isolation structures 80-82 may include a dielectric material. The isolation structure 82 has a thickness 90. In an embodiment, the thickness 90 is in a range from about 0.2 microns (um) to about 1 um. In the embodiment shown in FIG. 2, the isolation structures 80-82 are Local Oxidation of Silicon (LOCOS) devices (also referred to as field oxide). The LOCOS devices may be formed using a nitride mask and thermal-growing an oxide material through the mask openings. Alternatively, the isolation structures 80-82 may include shallow trench isolation (STI) devices or deep trench isolation (DTI) devices.

Thereafter, active regions of transistors are defined, and transistor devices (not shown) are formed. For example, these transistor devices may be Field Effect Transistor (FET) devices and may include source/drain regions and gate structures. The source/drain regions may be doped regions formed in the substrate 50 or a doped well, and the gate structures may include either polysilicon gate structures or metal gate structures. These gate structures may be referred to as low-voltage (LV) gate structures, as they are designed to handle voltages as high as a few volts.

Figure 3:
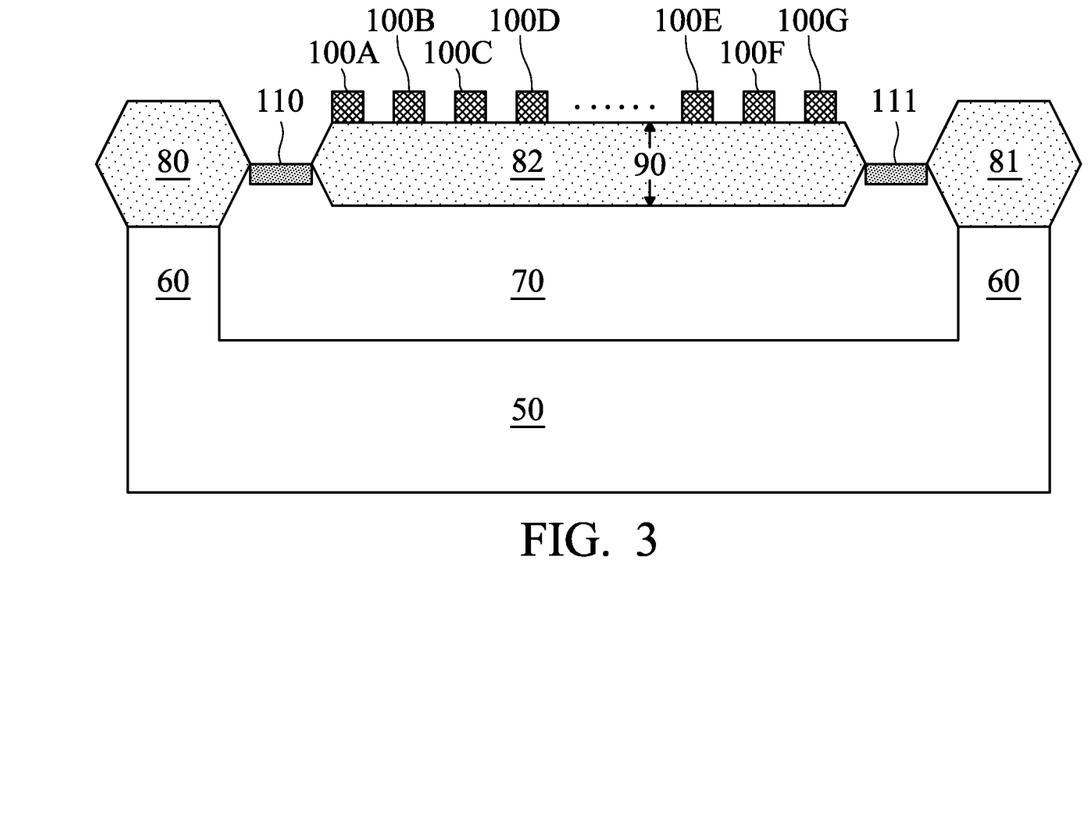

Referring now to FIG. 3, a resistor device 100 is formed over the isolation structure 82. The resistor device 100 has an elongate and winding shape. In one embodiment, the resistor device 100 has a zig-zag (or an S shape). In another embodiment, the resistor device 100 has a spiral shape. In yet another embodiment, the resistor device 100 has a square shape. These shapes will be more clearly viewed with reference to FIGS. 6-8 below, which illustrate top views of the resistor device 100. In the cross-sectional view shown in FIG. 3, the resistor device 100 appears as a plurality of resistor blocks 100A-100G. It is understood, however, that these resistor blocks 100A-100G are actually parts of an individual elongate resistor device.

In an embodiment, the resistor device 100 includes a polysilicon material, and may therefore be referred to as a polysilicon resistor. The polysilicon resistor 100 is designed to handle high voltages, for example voltages greater than about 100 volts, and may be as high as a few hundred volts. Thus, the polysilicon resistor 100 may also be referred to as a high voltage device. In that case, the polysilicon resistor 100 may be formed at the same time as when other high voltage polysilicon gates are formed. In other words, the polysilicon resistor 100 may be formed using the same processes that form other high voltage polysilicon gates.

Thereafter, heavily doped regions 110-111 are formed at the upper surface of the HVNW 70 and adjacent the isolation structure 82. In the embodiment shown, the heavily doped regions 110-111 are formed in between the isolation structures 80-82 and 81-82, respectively. The heavily doped regions 110-111 may be formed by one or more ion implantation processes. The heavily doped regions 110-111 have the same doping polarity (in this case N-type) as the HVNW 70, but with a higher doping concentration. The heavily doped regions 110-111 have a doping concentration level that is in a range from about $1 \times 10^{19}$ atoms/centimeter$^3$ to about $1 \times 10^{20}$ atoms/centimeter$^3$.

Figure 4:
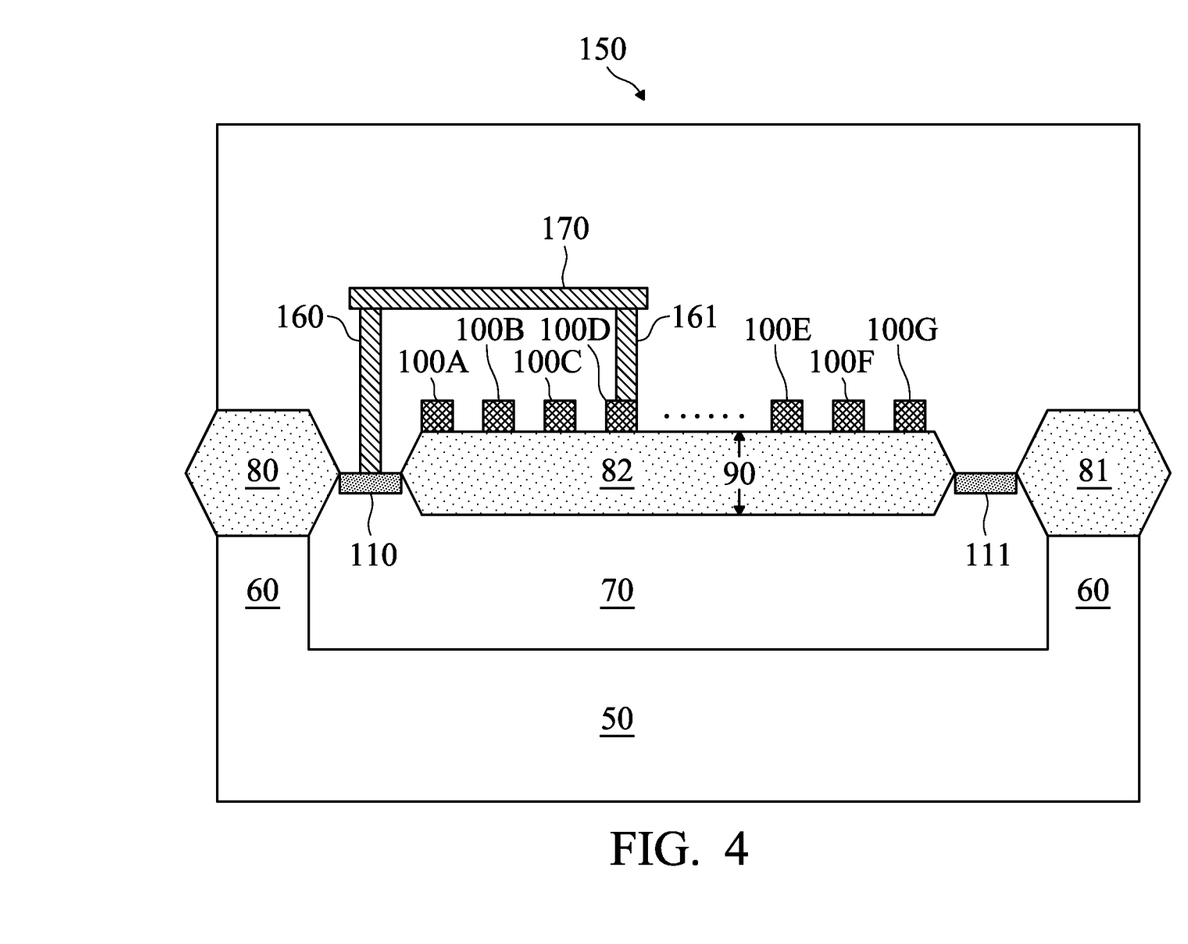

Referring now to FIG. 4, an interconnect structure 150 is formed over the isolation structures 80-82, the heavily doped regions 110-111, and the resistor device 100. The interconnect structure 150 includes a plurality of patterned dielectric layers and conductive layers that provide interconnections (e.g., wiring) between circuitries, inputs/outputs, and various doped features (for example, the HVNW 70). In more detail, the interconnect structure 150 may include a plurality of interconnect layers, also referred to as metal layers. Each of the interconnect layers includes a plurality of interconnect features, also referred to as metal lines. The metal lines may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines may be formed by a process including physical vapor deposition (PVD), chemical vapor deposition (CVD), sputtering, plating, or combinations thereof.

The interconnect structure 150 includes an interlayer dielectric (ILD) that provides isolation between the interconnect layers. The ILD may include a dielectric material such as a low-k material or an oxide material. The interconnect structure 150 also includes a plurality of contacts/contacts that provide electrical connections between the different interconnect layers and/or the features on the substrate, such as the HVNW 70 or the resistor device 100.

As part of the interconnect structure, a contact 160 is formed on the heavily doped region 110. As such, the contact 160 is electrically coupled to the heavily doped region 110 and therefore electrically coupled to the HVNW 70. An electrical bias can be applied to the HVNW 70 through the contact 160. Meanwhile, another contact 161 is formed on a segment 100D of the resistor device. The segment 100D is located between two opposite distal ends of the resistor device 100 (e.g., 100A and 100G), and it is located at or near a midpoint of the resistor device 100.

The midpoint of the resistor device is a point on the resistor device that is equidistant from the two opposite distal ends. As an example, if the resistor device 100 has a total length L that is measured along all the windings or turns of the resistor device, then the midpoint of the resistor device 100 is a point that is 0.5*L away from either of the two distal ends. Resistance of a device is a function of the device's length, width, height, and material. Thus, in an embodiment where the resistor device 100 has a relatively uniform width, height, and material composition throughout, the resistance of the portion of the resistor device on either side of the midpoint is 0.5*(overall resistance of the resistor device). According to Kirchhoff's law, voltage=current * resistance. Thus, as current remains fixed, voltage varies linearly with resistance. This means that a voltage at the midpoint of the resistor device is about $0.5*(V_{High}-V_{low})$, wherein $V_{High}$ is defined as the high voltage at one of the distal ends, and $V_{low}$ is defined as the low voltage at one of the distal ends (which is typically electrically grounded).

In the present embodiment, the segment 100D (coupled to the contact 161) is within 0.1*L of the midpoint of the resistor device 100, where L=overall length of the resistor device. Stated differently, the segment may be at, or no farther than, 0.1*L away from the midpoint. Another way of expressing this relationship is that a distance between the segment 100D and either the distal end 100A or the distal end 100G is in a range from about 0.4*L to about 0.6*L.

The interconnect structure 150 includes a metal line (or interconnect line) 170 that is electrically coupled to both the contact 160 and the contact 161. In this manner, the HVNW 70 is electrically biased to the same voltage as the segment 100D of the resistor device. In other words, the voltage at the segmented 100D—which will be a percentage of the voltage applied to one of the distal ends of the resistor device 100— will be the voltage at the HVNW 70. This type of biasing scheme offers advantages, which will be discussed below in more detail.

Figure 5:
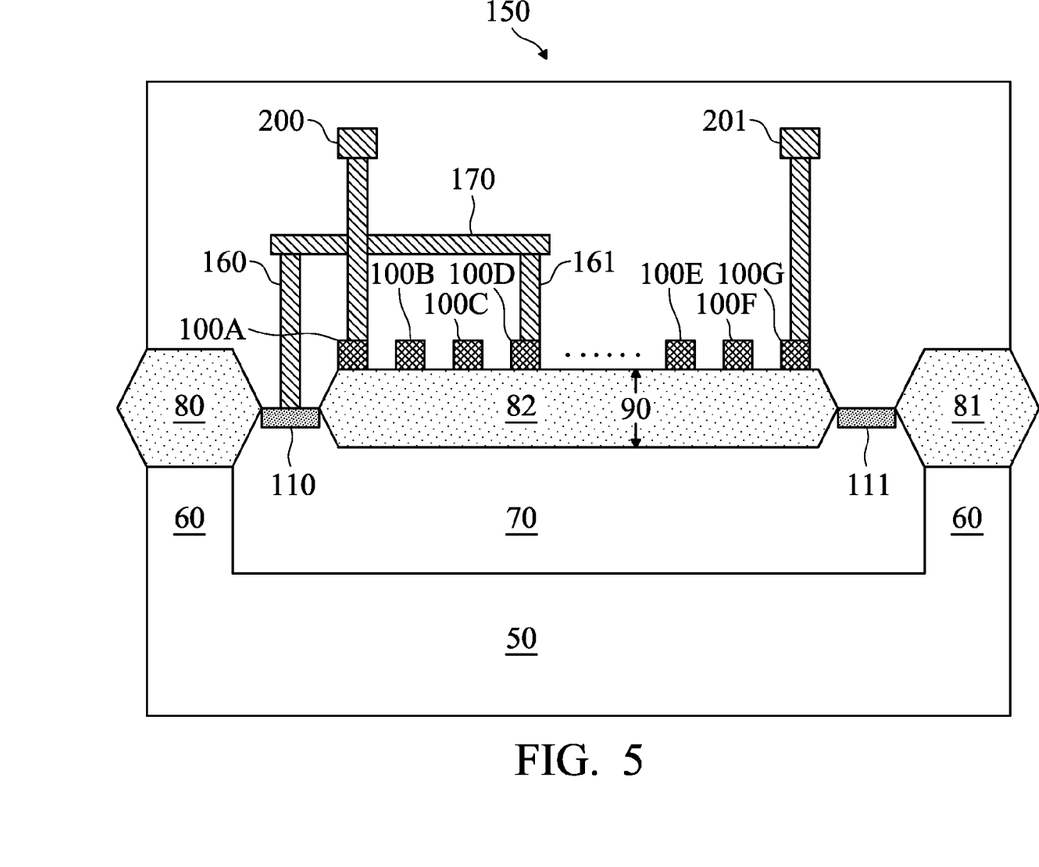

Referring now to FIG. 5, the distal end 100A of the resistor device is coupled to a terminal 200, and the distal end 100G of the resistor device is coupled to a terminal 201. The terminals 200 and 201 include conductive materials such as Al or Cu, or combinations thereof. The terminals 200 and 201 may be electrically coupled to the distal ends 100A and 100G through one or more respective contacts/contacts and/or metal lines, which are not necessarily illustrated in detail herein for the sake of simplicity. The terminals 200-201 also may or may not be formed directly over the resistor device 100.

The terminals 200 and 201 serve as electrical input/output points (or access points) for the resistor device 100. For example, a high voltage (on the order of a few hundred volts) can be applied to the terminal 200 while the terminal 201 can be grounded. Vice versa, a high voltage can be applied to the terminal 201 while the terminal 200 can be grounded.

As discussed above, the segment 100D experiences only a fraction of the high voltage applied at either the terminal 200 or the terminal 201. As an example, in an embodiment where a voltage of about 500 volts is applied to the terminal 201 and the terminal 200 is grounded, and where the segment 100D is located substantially at the midpoint of the resistor device 100, then the voltage at the segment 100D will be about 250 volts. As the location of segment 100D moves away from the midpoint and toward either the distal ends 100A or 100G, the voltage measured at the segment 100D will also drift away from 250 volts.

In an embodiment where $V_{High}$ is applied at one of the terminals 200-201, and the other one of the terminals is grounded, and the location of segment 100D is within 0.1*L away from the midpoint of the resistor device, then the voltage at the segment 100D will be in a range from about $0.4*V_{High}$ to about $0.6*V_{High}$, for example at about $0.5*V_{High}$. Since the heavily doped region 110 (and therefore the HVNW 70) is tied to segment 100D, this means the HVNW 70 is electrically biased to the voltage at segment 100D. In other words, the HVNW 70 is electrically biased close to a middle of the voltage difference between the two terminals 200-201, which is not done in conventional high voltage devices. Thus, for conventional high voltage devices, a high voltage potential exists between the HVNW and one of the distal ends of the resistor device. The device may suffer breakdown issues caused by such high voltage potential. The device breakdown is typically limited by the thickness 90 of the isolation structure 82. Typically, the conventional high voltage devices may experience device breakdown issues when $V_{High}$ exceeds about 470 volts.

In comparison, the embodiments herein electrically bias the HVNW 70 to have a voltage that is close to a middle of the voltage difference between the two terminals 200-201. As such, the device can tolerate a higher voltage difference before breakdown occurs, since the voltage at the HVNW 70 is not too different from either $V_{High}$ or $V_{Low}$. As an example, the device herein can tolerate a voltage difference of about 730 volts in an embodiment, as the HVNW 70 is biased to about half of 730 volts, which is about 365 volts. Stated differently, the device only needs to tolerate about 365 volts to enable a high voltage of about 730 volts to be applied to one of its terminals (the other terminal is grounded). Meanwhile, the thickness 90 of the isolation structure can remain about the same as conventional devices, since the embodiments herein need not rely on increase in thickness of the isolation structure 82 to improve its tolerance of high voltages. Additionally, the biased HVNW 70 may also extend a depletion region in the substrate 50, which may further improve the device's electrical performance.

Additional fabrication processes may be performed to complete the fabrication of the semiconductor device shown in FIGS. 2-5. For example, the semiconductor device may undergo passivation, wafer acceptance testing, and wafer dicing processes. For the sake of simplicity, these additional processes are not shown or discussed herein.

Figure 6:
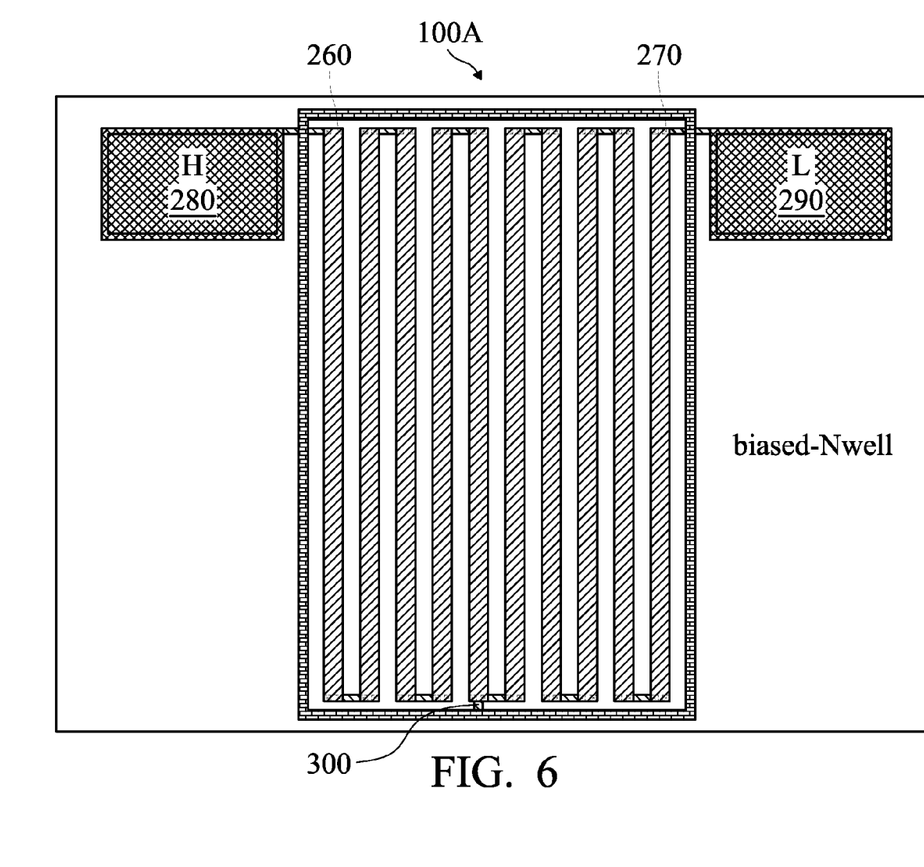
FIGS. 6-8 are simplified top views of different embodiments of a high voltage resistor according to various aspects of the present disclosure, respectively.

Referring now to FIG. 6, a simplified top view of an embodiment of a resistor device 100A is illustrated. In this embodiment, the resistor device 100A has an elongated zig-zag shape, or an S-shape. The resistor device 100A has two opposite distal ends 260 and 270. The distal ends 260 and 270 are electrically coupled to terminals 280 and 290, respectively. A high voltage may be applied to the terminal 280 while the terminal 290 is grounded, or vice versa. Thus, a high voltage potential exists across the resistor device 100A through the terminals 260 and 270. The resistor device 100A has a midpoint 300 that is equidistant (in terms of distance along the resistor 100A, rather than absolute distance between two points) from the two distal ends 260 and 270. According to the various aspects of the present disclosure, a high voltage N-well underneath the resistor device 100A may be electrically coupled to the midpoint 300, or close to it (for example within 10% of the total length of the resistor device 100A). As discussed above, such configuration allows the resistor device 100A to have better breakdown performance—it can tolerate a higher voltage before breakdown occurs.

Figure 7:
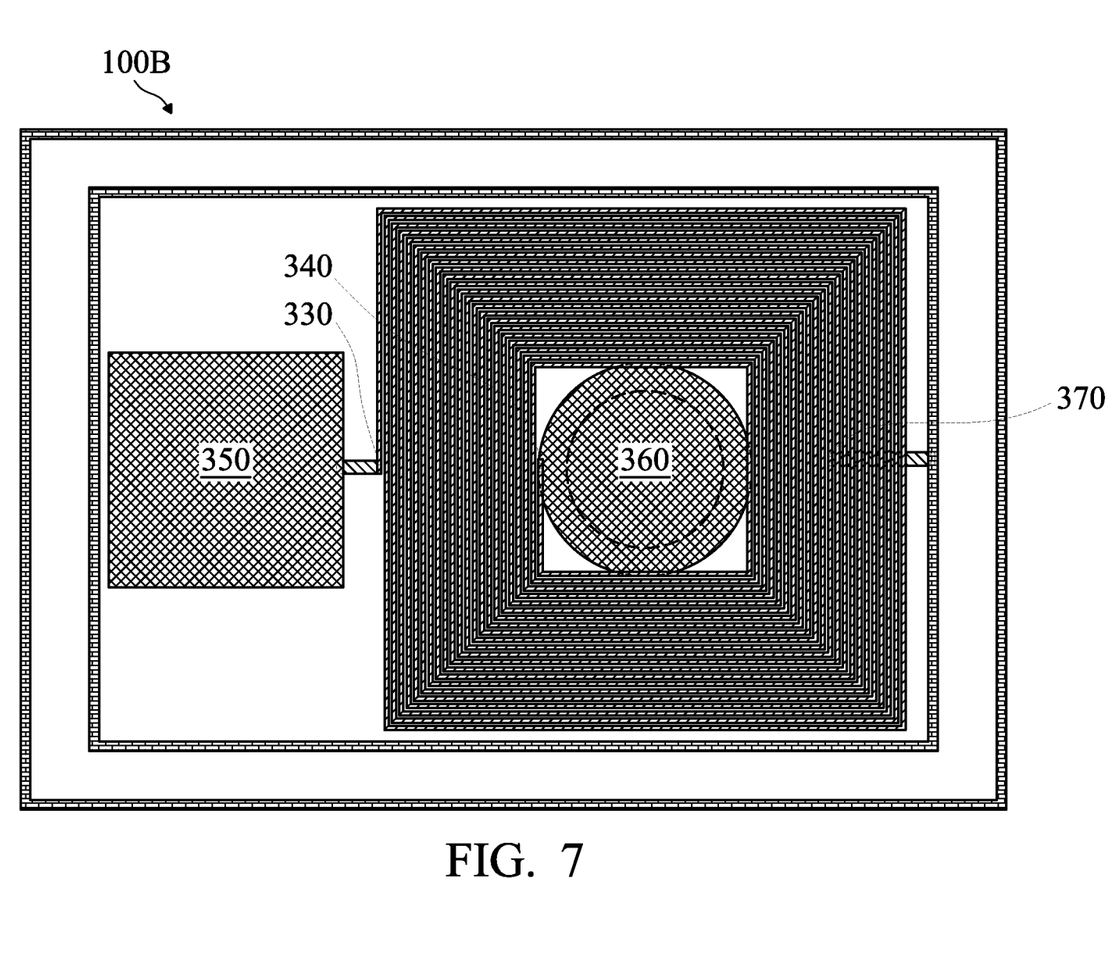

FIG. 7 illustrates another simplified top view of an embodiment of a resistor device 100B. In this embodiment, the resistor device 100B has an elongated square shape. The resistor device 100B has two opposite distal ends 330 and 340. The distal ends 330 and 340 are electrically coupled to terminals 350 and 360, respectively. A high voltage may be applied to the terminal 350 while the terminal 360 is grounded, or vice versa. Thus, a high voltage potential exists across the resistor device 100B through the terminals 350 and 360. The resistor device 100B has a midpoint 370 that is equidistant (in terms of distance along the resistor 100B, rather than absolute distance between two points) from the two distal ends 330 and 340. According to the various aspects of the present disclosure, a high voltage N-well underneath the resistor device 100B may be electrically coupled to the midpoint 370, or close to it (for example within 10% of the total length of the resistor device 100B). For reasons similar to those discussed above with reference to FIG. 6, such configuration allows the resistor device 100B to have better breakdown performance.

Figure 8:
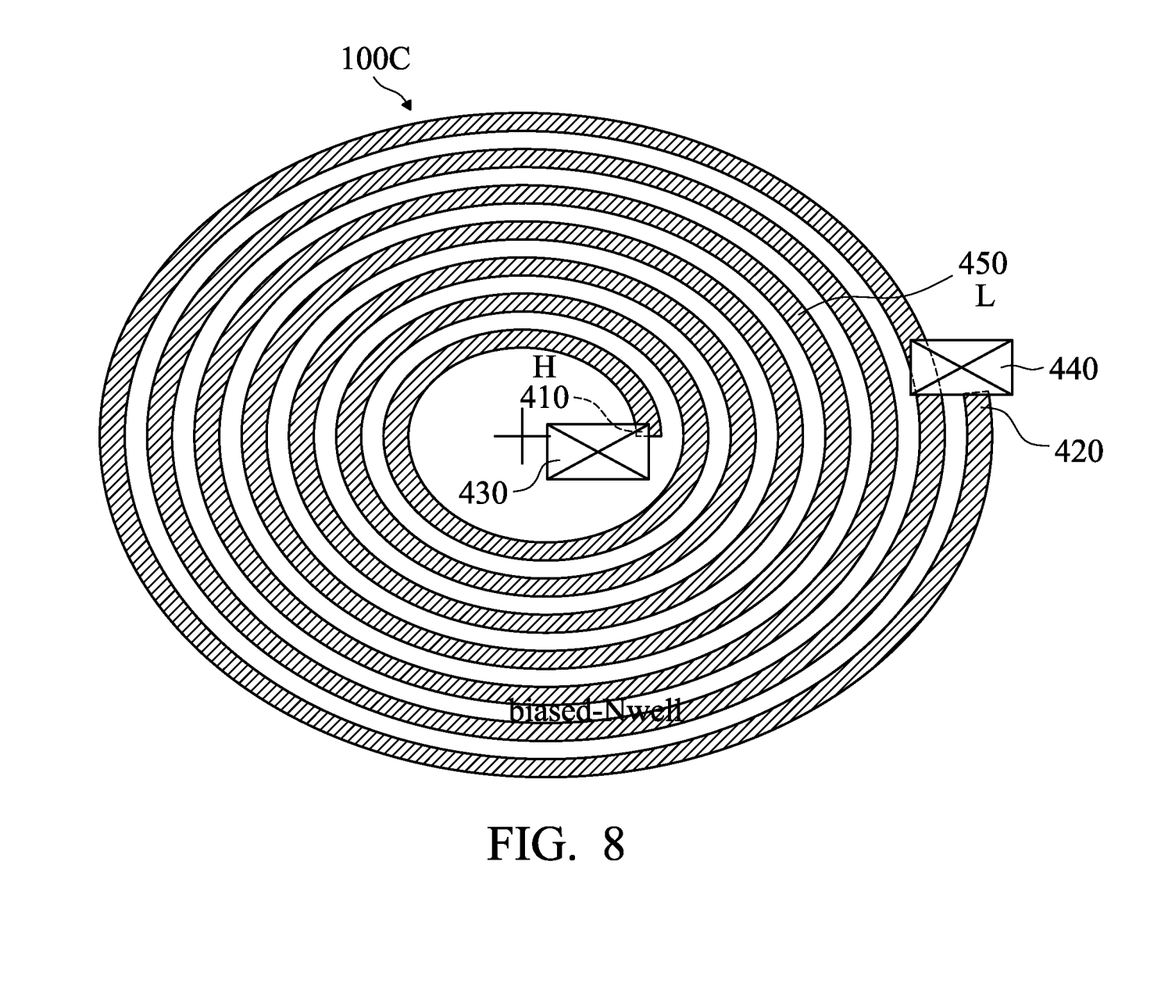

FIG. 8 illustrates another simplified top view of an embodiment of a resistor device 100C. In this embodiment, the resistor device 100C has an elongated spiral shape. The resistor device 100C has two opposite distal ends 410 and 420. The distal ends 410 and 420 are electrically coupled to terminals 430 and 440, respectively. A high voltage may be applied to the terminal 430 while the terminal 440 is grounded, or vice versa. Thus, a high voltage potential exists across the resistor device 100C through the terminals 430 and 440. The resistor device 100C has a midpoint 450 that is equidistant (in terms of distance along the resistor 100C, rather than absolute distance between two points) from the two distal ends 410 and 420. According to the various aspects of the present disclosure, a high voltage N-well underneath the resistor device 100C may be electrically coupled to the midpoint 450, or close to it (for example within 10% of the total length of the resistor device 100C). For reasons similar to those discussed above with reference to FIG. 6, such configuration allows the resistor device 100C to have better breakdown performance.

Figure 9:
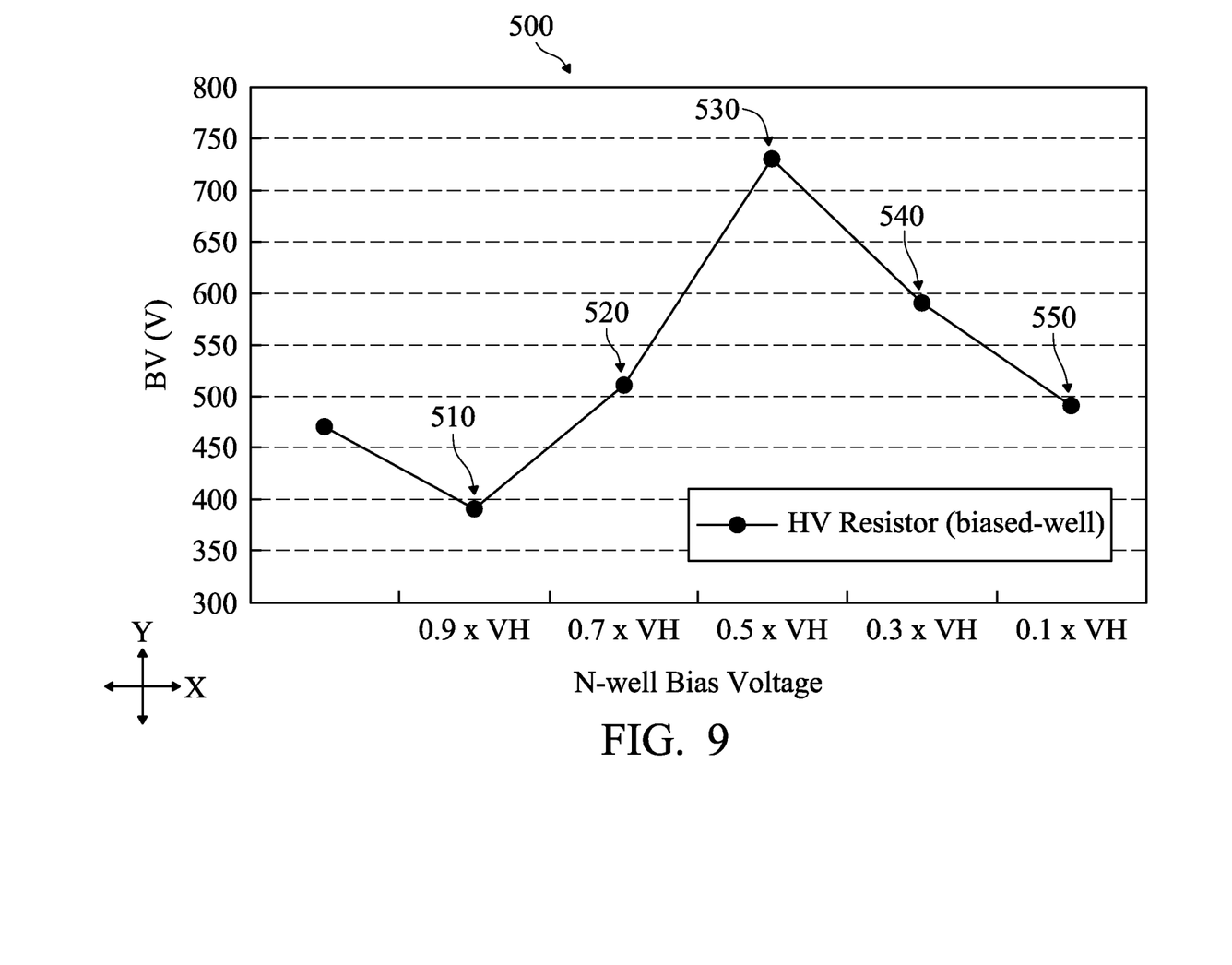
FIG. 9 is a chart illustrating a relationship between breakdown voltage VS electrical biasing voltage of a high voltage N-well according to various aspects of the present disclosure.

FIG. 9 is a chart 500 illustrating the relationship between breakdown voltage and the biased voltage of the high voltage N-well. An X-axis of the chart 500 represents the amount of bias voltage at the high voltage N-well below the resistor device. This bias voltage varies depending on where in the resistor device the high voltage N-well is tied to. A Y-axis of the chart 500 represents the breakdown voltage (BV). For example, at point 510, the high voltage N-well is tied to a point on the resistor device that is 0.1*L away from the high voltage distal end, where L=total length of the resistor device. Thus, the bias voltage of the N-well at point 510 is 0.9*VH, where VH=voltage difference applied across the resistor device. Since point 510 is relatively close to the distal end and not close to the midpoint of the resistor device, the breakdown voltage at point 510 is not optimal—slightly less than about 400 volts in this case.

Similarly, at point 520, the high voltage N-well is tied to a point on the resistor device that is 0.3*L away from the high voltage distal end, and the bias voltage of the N-well at point 520 is 0.7*VH. Since point 520 is closer to the midpoint of the resistor device than point 510, the breakdown voltage at point 520 is better—slightly greater than about 520 volts in this case—even though it is still not optimal yet.

At point 530, the high voltage N-well is tied to approximately the midpoint of the resistor device, and the bias voltage of the N-well at point 530 is 0.5*VH. The breakdown voltage at point 530 is now substantially optimal and reaches about 730 volts.

At points 540 and 550, the high voltage N-well is tied to points on the resistor device that is 0.7*L away and 0.9*L away from the high voltage distal end (or 0.3*L away and 0.1*L away from the low voltage distal end), respectively. Thus, the bias voltage at points 540 and 550 are at 0.3*VH and 0.1*VH, respectively, and the breakdown performance of the resistor device at points 540 and 550 once again begin suffer. Thus, from the chart 500, it can be seen that the resistor device tends to reach optimal breakdown performance when the high voltage N-well is tied close to the midpoint of the resistor device.

The embodiments discussed above offer advantages over conventional high voltage devices, it being understood that different embodiments may offer different advantages, and that no particular advantage is required for all embodiments. One advantage is that through proper biasing of the high voltage N-well, the breakdown performance of the resistor device can be significantly improved. Another advantage is that the biasing of the high voltage N-well requires no extra fabrication processes and is compatible with existing process flow. Thus, the implementation of the embodiments discussed herein does not incur increased costs.

One of the broader forms of the present disclosure involves a semiconductor device that includes: a doped region; an insulating device disposed over a portion of the doped region; a resistor disposed over the insulating device, wherein the resistor includes a first terminal at one distal end and a second terminal at an opposite distal end; and an interconnect structure disposed over the resistor, wherein the interconnect structure is coupled to both the doped region and a portion of the resistor that is disposed in between the first and second terminals.

Another of the broader forms of the present disclosure involves a semiconductor device that includes: a substrate doped with a first doping polarity; a doped well located in the substrate, the doped well having a second doping polarity opposite the first doping polarity; a dielectric structure located on the doped well, wherein a portion of the doped well adjacent the dielectric structure has a higher doping concentration than a remaining portion of the doped well; and an elongate polysilicon structure located on the dielectric structure; wherein: the elongate polysilicon structure has a length L; the portion of the doped well adjacent the dielectric structure is electrically coupled to a segment of the elongate polysilicon structure that is located away from a midpoint of the elongate polysilicon structure by a predetermined distance that is measured along the elongate polysilicon structure; and the predetermined distance is in a range from about 0*L to about 0.1*L.

Still another of the broader forms of the present disclosure involves a method. The method includes: forming a doped well in a substrate; forming a dielectric structure partially over the doped well; forming an elongate resistor over the dielectric structure, the elongate resistor having a first distal end and a second distal end opposite the first distal end; and forming an interconnect structure over the elongate resistor, wherein the interconnect structure couples together the doped well with a segment of the elongate resistor that is disposed between the first and second distal ends.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a doped region;
   an insulating device disposed over a portion of the doped region;
   a resistor disposed over the insulating device, wherein the resistor includes a first terminal at one distal end and a second terminal at an opposite distal end; and
   a continuous interconnect structure disposed over the resistor, wherein the interconnect structure is coupled to both the doped region and a portion of the resistor that is disposed in between the first and second terminals;
   wherein:
   the resistor has a length L;
   the portion of the resistor electrically coupled to the doped region through the interconnect structure is in direct physical contact with the interconnect structure;
   the portion of the resistor is spaced apart from one of the first and second terminals by a distance measured along the resistor; and
   the distance is in a range from about 40% of the length L to about 60% of the length L.

2. The semiconductor device of claim 1, wherein the portion of the polysilicon resistor electrically coupled to the doped region is approximately equidistant from the first and second terminals.

3. The semiconductor device of claim 1, wherein the doped region is disposed in a substrate that has an opposite doping polarity than the doped region.

4. The semiconductor device of claim 1, wherein:
   the resistor includes a polysilicon material; and
   the insulating device includes a dielectric material.

5. The semiconductor device of claim 1, wherein:
   the doped region includes a heavily doped portion disposed at an upper surface of the doped region and adjacent the insulating device; and
   the interconnect structure includes:
   a first contact that is coupled to the heavily doped portion of the doped region;
   a second contact that is coupled to the portion of the resistor; and
   an interconnect line that is coupled to the first and second contacts.

6. The semiconductor device of claim 1, wherein the resistor has one of: a zig-zag shape, a square shape, and a spiral shape.

7. The semiconductor device of claim 1, wherein the doped region includes a buried well.

8. A semiconductor device, comprising:
a substrate doped with a first doping polarity;
a doped well located in the substrate, the doped well having a second doping polarity opposite the first doping polarity;
a dielectric structure located on the doped well, wherein a portion of the doped well adjacent the dielectric structure has a higher doping concentration than a remaining portion of the doped well; and
an elongate polysilicon structure located on the dielectric structure;
wherein:
the elongate polysilicon structure has a length L;
the portion of the doped well adjacent the dielectric structure is biased to the same voltage as a segment of the elongate polysilicon structure, the segment of the elongate polysilicon structure being located away from a midpoint of the elongate polysilicon structure by a predetermined distance that is measured along the elongate polysilicon structure; and
the predetermined distance is in a range from about 0*L to about 0.1*L.

9. The semiconductor device of claim 8, further including an interconnect structure that is located over the elongate polysilicon structure;
wherein:
the interconnect structure includes a plurality of contacts and interconnect lines; and
the portion of the doped well adjacent the dielectric structure is electrically coupled to the segment of the elongate polysilicon structure by a subset of the contacts and a subset of the interconnect lines.

10. The semiconductor device of claim 9, wherein the segment of the elongate polysilicon structure is in direct physical contact with the interconnect structure.

11. The semiconductor device of claim 8, wherein:
the elongate polysilicon structure includes two distal ends; and
the midpoint of the elongate polysilicon structure is substantially equidistant from the two distal ends.

12. The semiconductor device of claim 8, wherein:
the dielectric structure includes field oxide;
the substrate is doped with a P-type dopant; and
the doped well is doped with an N-type dopant.

13. The semiconductor device of claim 8, wherein the elongate polysilicon structure has one of: a zig-zag shape, a square shape, and a spiral shape.

14. A semiconductor device, comprising:
a substrate having a first type of conductivity;
a doped region disposed in the substrate, the doped region having a second type of conductivity different from the first type;
a dielectric structure disposed over a portion of the doped region;
a resistor disposed over the dielectric structure, wherein the resistor has an elongate shape and a first distal end and a second distal end;
a first conductive element disposed over, and electrically coupled to, the doped region;
a second conductive element disposed over a segment of the resistor that is located in between the first distal end and the second distal end, wherein the second conductive element is in direct contact with the segment of the resistor; and
a third conductive element that is electrically coupled to the first conductive element and the second conductive element
wherein:
the first and second conductive elements are contacts of an interconnect structure; and
the third conductive element is a metal line of the interconnect structure.

15. The semiconductor device of claim 14, wherein the resistor contains a polysilicon material.

16. The semiconductor device of claim 14, wherein the resistor has a zig-zag shape, a square shape, or a spiral shape from a top view.

17. The semiconductor device of claim 14, wherein:
the resistor has a length L;
the segment of the resistor is located less than about 0.1L away from a midpoint of the resistor.

18. The semiconductor device of claim 14, wherein the dielectric structure includes a field oxide structure.

19. The semiconductor device of claim 14, wherein an entirety of the resistor is disposed on an upper surface of the dielectric structure.

20. The semiconductor device of claim 14, wherein the doped region includes a buried well.

* * * * *